(12) United States Patent
Edelstein et al.

(10) Patent No.: US 7,375,526 B2
(45) Date of Patent: *May 20, 2008

(54) ACTIVE-PASSIVE ELECTROMAGNETIC SHIELDING TO REDUCE MRI ACOUSTIC NOISE

(76) Inventors: William A. Edelstein, 16 Oak Tree La., Schenectady, NY (US) 12309; Tesfaye K. Kidane, 2540 N. Morland Blvd., Apt. #2D, Shaker Heights, OH (US) 44120; Victor Taracilla, 2441 Overlook Rd. #14, Cleveland, OH (US) 44106; Tanvir N. Baig, 2536 Overlook Rd., #203, Cleveland, OH (US) 44106; Timothy P. Eagan, 12700 Fairhill Rd., Apt. 202, Shaker Heights, OH (US) 44120; Robert W. Brown, 34285 Lakeview Rd., Solon, OH (US) 44139

( * ) Notice: Subject to any disclaimer, the term of this patent is extended or adjusted under 35 U.S.C. 154(b) by 63 days.

This patent is subject to a terminal disclaimer.

(21) Appl. No.: 11/551,413

(22) Filed: Oct. 20, 2006

(65) Prior Publication Data

US 2008/0094062 A1  Apr. 24, 2008

(51) Int. Cl.
*G01V 3/00* (2006.01)
(52) U.S. Cl. ...................... 324/318; 324/307
(58) Field of Classification Search ........ 324/300–322; 600/407–455; 335/301, 216, 296, 306
See application file for complete search history.

(56) References Cited

U.S. PATENT DOCUMENTS 4,617,516 A   10/1986   Schenck (Continued)

OTHER PUBLICATIONS

Edelstein, W.A. et al., "Active-Passive Gradient Shielding for MRI Acoustic Noise Reduction", Proc. Intl. Soc. Mag. Reson. Med. 11, 747 (2004) p. 1.

(Continued)

*Primary Examiner*—Brij B Shrivastav
(74) *Attorney, Agent, or Firm*—Hoffman, Warnick & D'Alessandro LLC

(57) ABSTRACT

The present invention provides an apparatus for reducing acoustic noise in a magnetic resonance imaging device including passive shielding located outside the actively shielded gradient winding elements in order to reduce the magnitude of fields that spread outside the gradient coil assembly in unwanted directions and interact with the magnet cryostat or other metallic magnet parts, inducing eddy currents that cause consequent acoustic noise. The passive shielding elements are conducting layers located on the outer radius of the cylindrical gradient coil assembly in a cylindrical magnet system, conducting layers located at the ends of the gradient coil assembly in a cylindrical magnet system, and conducting layers located inside the actively shielded gradient winding inner elements in a cylindrical magnet system. The passive shielding could also be located on separate structures that are vibrationally isolated from the magnet cryostat. The actively shielded gradient winding can also be extended to portions at the ends of the actively shielded gradient winding and further to portions inside the inner radius of the inner portion of the actively shielded gradient winding. The actively shielded gradient windings and passive shielding should be designed concurrently in order to substantially optimize the gradient linearity and reduce the eddy currents generated in metallic parts of the magnetic resonance imaging system.

19 Claims, 9 Drawing Sheets

U.S. PATENT DOCUMENTS

| | | |
|---|---|---|
| 5,481,191 A | 1/1996 | Rzedzian |
| 5,530,355 A | 6/1996 | Doty |
| 5,596,303 A | 1/1997 | Akgun et al. |
| 5,773,976 A | 6/1998 | Sakakura et al. |
| 6,326,788 B1 * | 12/2001 | Mulder et al. ............... 324/318 |
| 6,642,717 B2 | 11/2003 | Dietz et al. |
| 6,810,990 B2 | 11/2004 | Dean et al. |
| 6,885,194 B2 * | 4/2005 | Boskamp .................... 324/318 |
| 6,952,099 B2 | 10/2005 | Renz et al. |
| 7,109,712 B2 * | 9/2006 | Boskamp .................... 324/318 |
| 7,141,974 B2 * | 11/2006 | Edelstein et al. ........... 324/318 |
| 7,242,191 B2 * | 7/2007 | Laskaris et al. ............. 324/318 |
| 2003/0206017 A1 | 11/2003 | Boskamp |
| 2004/0100261 A1 | 5/2004 | Laskaris et al. |

OTHER PUBLICATIONS

Edelstein, W.A. et al., "Making MRI Quieter", Magnetic Resonance Imaging 20 (2002) pp. 155-163.

* cited by examiner

ACTIVE-PASSIVE ELECTROMAGNETIC SHIELDING TO REDUCE MRI ACOUSTIC NOISE

This application claims the benefit of: U.S. Provisional Application No. 60/497,267, filed Aug. 25, 2003; U.S. Provisional Application No. 60/500,225, filed Sep. 5, 2003; and U.S. Provisional Application No. 60/570,593, filed May 13, 2004; and U.S. application Ser. No. 10/925,691, filed Aug. 25, 2004, which are hereby incorporated herein by reference.

BACKGROUND OF THE INVENTION

The present invention relates generally to a magnetic resonance imaging (MRI) scanner and more particularly to a low acoustic noise MRI scanner.

MRI scanners, which are used in various fields such as medical diagnostics, typically create images based on the operation of a magnet, a gradient coil assembly, and a radiofrequency coil(s). The magnet creates a uniform main magnetic field that makes unpaired nuclear spins, such as hydrogen atomic nuclei, responsive to radiofrequency excitation via the process of nuclear magnetic resonance (NMR). The gradient coil assembly imposes a series of pulsed, spatial-gradient magnetic fields upon the main magnetic field to give each point in the imaging volume a spatial identity corresponding to its unique set of magnetic fields during an imaging pulse sequence. The radiofrequency coil applies an excitation rf (radiofrequency) pulse that temporarily creates an oscillating transverse nuclear magnetization in the sample. This sample magnetization is then detected by the excitation rf coil or other rf coils. The resulting electrical signals are used by the computer to create magnetic resonance images. Typically, there is a radiofrequency coil and a gradient coil assembly within the magnet.

Magnets for MRI scanners include superconductive-coil magnets, resistive-coil magnets, and permanent magnets. Known superconductive magnet designs include cylindrical magnets and open magnets. Cylindrical magnets typically have an axially-directed static magnetic field. In MRI systems based on cylindrical magnets, the radiofrequency coil, the gradient coil assembly and the magnet are generally annularly-cylindrically shaped and are generally coaxially aligned, wherein the gradient coil assembly circumferentially surrounds the radiofrequency coil and wherein the magnet circumferentially surrounds the gradient coil assembly. Open magnets typically employ two spaced-apart magnetic assemblies (magnet poles) with the imaging subject inserted into the space between the assemblies. This scanner geometry allows access by medical personnel for surgery or other medical procedures during MRI imaging. The open space also helps the patient overcome feelings of claustrophobia that may be experienced in a cylindrical magnet design.

A gradient coil assembly comprises a set of windings in a support structure that produce the desired gradient fields. Such an assembly for a human-size whole-body MRI scanner typically weighs about 1000 kg. The windings consist of wires or conductors formed by cutting or etching sheets of conducting material (e.g. copper) to form current paths to generate desired field patterns. The wires or conducting coils or plates are themselves typically held in place by fiberglass overwindings plus epoxy resin.

Generally, the various components of the MRI scanner represent sources and pathways of acoustic noise that can be objectionable to the patient being imaged and to the operator of the scanner. For example, the gradient coil assembly generates loud acoustic noises, which many medical patients find objectionable. The acoustic noises occur in the imaging region of the scanner as well as outside of the scanner. Known passive noise control techniques include locating the gradient coil assembly in a vacuum enclosure.

Large pulsed electrical currents, typically 200 A or more, with rise times and durations typically in the submillisecond to millisecond range, are applied to the windings. Because these windings are located in strong static magnetic fields (e.g., 1.5 T for a typical clinical imager to much higher values for research systems), the currents interact with the static field and strong Lorentz forces are exerted on different parts of the gradient coil assembly. These forces in turn compress, expand, bend or otherwise distort the gradient coil assembly. It will be readily understood by those skilled in the art that the frequencies of the acoustic noise so generated will be in the audio range. Typically there are strong components of noise from 50 Hz and below to several kHz at the upper end of the frequency range.

The magnet cryostat and other metallic parts of the magnet assembly are also sources of vibration and acoustic noise. For a cylindrical magnet, the actively shielded gradient winding generally comprises three layers, one for each Cartesian direction (x, y and z), each layer typically consisting of an inner, primary winding portion that creates a gradient field in the imaging region plus an outer, concentric shielding winding portion that substantially reduces the fields outside the gradient assembly. Some of the gradient-produced fields leak through or around the shielding. These leakage fields can induce eddy currents in the magnet metallic parts, for example, the cryostat inner bore. These eddy currents in turn produce Lorentz forces on the cryostat inner bore leading to mechanical motion of the cryostat inner bore and consequent acoustic noise according to WA Edelstein et al., *Magnetic Resonance Imaging* 20, 155-163, 2002.

The shielded gradients described above are constructed with inner gradient windings to produce gradient fields Gx, Gy and Gz of the main Bo field along axes x, y and z. They also have larger diameter shielding windings designed to substantially cancel external fields produce by the inner gradient windings so that the net fields outside the shielding windings are substantially zero. There are generally three separate inner windings, one for each of the directions x, y and z, and three separate outer, shielding windings, one for each of the directions x, y and z. The complete x-gradient winding consists of various parts, including inner and shielding windings, which are generally electrically connected to form a single electrical circuit. The configurations of y- and z-gradient windings are similar. Up to the present, the general practice has been to design the inner and shielding windings so that each axis has a single layer of inner windings and a single layer of shielding windings. Typically, the inner x-winding is electrically connected in series to the outer, shielding x-winding and the inner plus outer x-winding circuit is then powered by a single power supply. The same is true of the y- or z-winding.

FIG. 1A is a cross-sectional side view of a conventional actively shielded gradient. 304 is the metallic inner bore of the magnet cryostat. 20 is the inner gradient windings and 30 is the outer, shielding gradient windings. 20 and 30 are supported in 102, a solid, nonconducting annular support structure.

However, the active gradient shielding is not perfect, as some pulsed magnetic fields leak through and around the shielding windings, interact with the magnet or cryostat structure and cause eddy currents in those structures. As shown in Schenck et al., U.S. Pat. No. 4,617,516, 1986, the z-gradient windings are generally made using a wire wound in one direction from one end of the gradient to the center, and the wire reverses from the center outward. Substantial field can leak through the widely spaced turns in the center. For all windings, field can leak around the ends of the windings to interact with the cryostat or other metallic parts of the magnet structure. It has been shown that eddy currents in the metallic inner bore of the magnet cryostat produced Lorentz forces on the inner bore leading to vibrations of the inner bore and consequent acoustic noise (WA Edelstein et al., *Magnetic Resonance Imaging* 20, 155-163, 2002.)

Some recent designs to improve gradient active shielding produce increasingly complex gradient current patterns. The length of these windings must be limited to ensure efficient gradient operation. Compromises thereby incurred limit the effectiveness of the additional shielding achieved. The recent quest for shorter length and rapidly changing gradients has also tended to work against effective shielding.

The active gradient shields in cylindrical magnet MRI systems heretofore has been confined to a cylindrical surface disposed concentrically relative to the magnet. This arrangement is not the best configuration to produce the most effective shielding.

Passive shielding alone will not provide adequate shielding and eddy current control because of its finite time constants. Multiple layers of active gradient shielding will have limited effectiveness because active gradient shielding must have discrete current paths. We are proposing the use of passive gradient shielding in conjunction with active gradient shielding. One example of this approach is disclosed in Mulder et al., U.S. Pat. No. 6,326,788, 2001. FIG. 3 is a cross-sectional side view of their design. It is similar to the conventional actively shielded gradient shown in FIG. 1 with the addition of a passive shield 210 consisting of a conducting layer on the outer radius of the solid, nonconducting annular cylindrical support structure 102. The idea of passive shielding acting in combination with active shielding can be extended further with substantially improved efficacy.

What is needed is a method of drastically reducing gradient-induced eddy currents in the magnet cryostat and other magnet parts, and to mitigate consequent vibrations, in order to substantially alleviate one of the principal sources of acoustic noise in MRI scanners.

SUMMARY OF THE INVENTION

The present invention provides a method and apparatus for generating magnetic resonance images with reduced acoustic noise. In one embodiment, such an apparatus includes a gradient coil assembly passive shielding element including at least one conducting element outside the actively shielded gradient coil winding. The passive shielding element is located outside the gradient winding elements and is positioned to substantially block leakage fields that can otherwise produce eddy currents in the magnet cryostat and other magnet structures.

A first aspect of the invention is directed toward a method for reducing acoustic noise in a magnetic resonance imaging device, the method comprising the steps of providing a passive shielding element adjacent an actively shielded gradient coil winding of the device and ensuring an active gradient shielding winding is insulated from the passive shielding element, wherein a first portion of the passive shielding element is located adjacent an outer surface of the actively shielded gradient coil winding and a second portion is located adjacent an end of the actively shielded gradient coil winding.

A second aspect of the invention is directed towards an apparatus for reducing acoustic noise in a magnetic resonance imaging device, the apparatus comprising an actively shielded gradient coil winding, an annular support structure substantially enclosing the actively shielded gradient coil winding, and a passive shielding element adjacent the actively shielded gradient coil winding, wherein a first portion of the passive shielding element is adjacent an outer surface of the actively shielded gradient coil and a second portion is adjacent an end of the actively shielded gradient coil and positioned to form a non-perpendicular angle with the first portion.

A third aspect of the invention is directed toward an apparatus for reducing acoustic noise in a magnetic resonance imaging device, the apparatus comprising: an actively shielded gradient coil winding; an annular cylindrical support structure substantially enclosing the actively shielded gradient coil winding; and an electrically conductive passive shielding element adjacent the actively shielded gradient coil winding, wherein a first portion of the passive shielding element is adjacent an outer surface of the actively shielded gradient coil and a second curvilinearly shaped portion is adjacent an end of the actively shielded gradient coil.

The foregoing and other features of the invention will be apparent from the following more particular description of embodiments of the invention.

BRIEF DESCRIPTION OF THE DRAWINGS

The features and advantages of the present invention will become apparent from the following detailed description of the invention when read with the accompanying drawings in which.

DETAILED DESCRIPTION OF INVENTION

Figure 1:
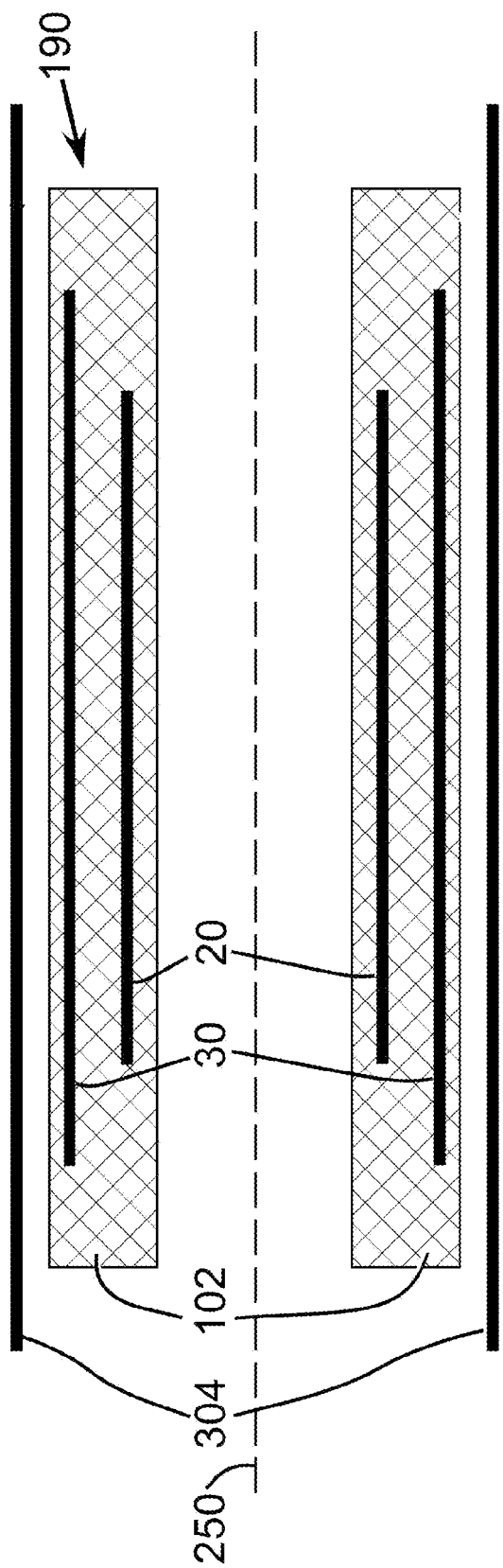
FIG. 1 is a cross-sectional side view of a prior art actively shielded gradient assembly without passive shielding.
Figure 2:
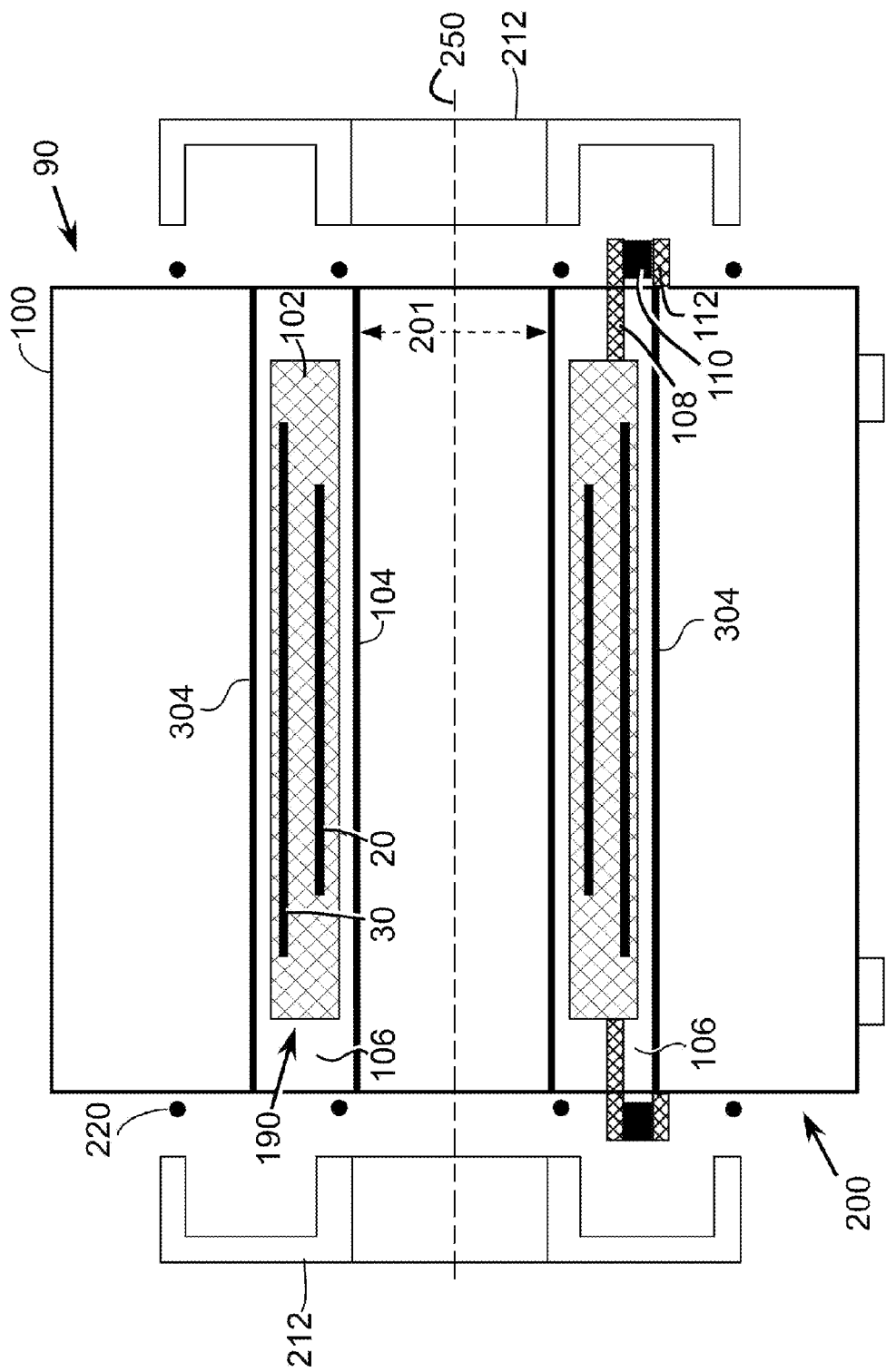
FIG. 2 is a cross-sectional side view of an entire magnetic resonance imaging system showing magnet and a prior art gradient coil assembly.

Referring to FIG. 2 there is shown an illustrative MRI device 90 to which embodiments of the present invention are applicable. MRI device 90 is of a type useful in producing magnetic resonance (MR) images of a patient or subject. Throughout the figures, like numerals represent like elements. FIGS. 1-6 show MRI device 90 based on a closed, cylindrical superconducting magnet assembly 200. It is to be appreciated by one skilled in the art that the functions and descriptions of the present invention are equally applicable to an open magnet configuration.

FIG. 1 is a cross-sectional side view of a prior art actively shielded gradient assembly. The actively shielded gradient coil winding consists of an inner active gradient winding portion 20 and an outer gradient winding portion 30. Generally these are electrically connected in series and powered by a single power amplifier. They could be powered by two separate power amplifiers. The active gradient coil winding 20 plus 30 is embedded in an insulating support matrix 102, typically comprised of fiberglass-epoxy or other filler materials.

Referring to FIG. 2, this type of cylindrical magnet assembly, with center axis 250, comprises an inner surface referred to as a magnet cryostat inner bore 304 and a cryostat shell 100 disposed radially around the outer surface. The magnet assembly further comprises end cap seals 212. When end cap seals 212 are secured against rubber gaskets 220 positioned between end cap seals 212 and cryostat shell 100, and secured against other rubber gaskets 220 positioned between end cap seals 212 and patient tube 104, an airtight region 106 containing the gradient coil assembly 190 is created.

Typically, cryostat shell 100 encloses a superconductive magnet (not shown) that, as is well-known, includes several radially-aligned and longitudinally spaced-apart superconductive coils, each capable of carrying a large electric current. The superconductive coils produce a homogeneous, main static magnetic field, known as $B_0$, typically in the range from 0.5 T to 8 T, aligned along the center axis 250. Cryostat shell 100 is generally metallic, typically steel or stainless steel.

A patient or imaging subject (not shown) is positioned within a cylindrical imaging volume 201 surrounded by patient bore tube 104. Bore tube 304 is typically made of electrically conducting material such as stainless steel. Gradient coil assembly 102 is disposed around in a spaced apart coaxial relationship therewith and generates time-dependent gradient magnetic field pulses in a known manner. Radially disposed around gradient coil assembly 102 is cryostat shell 100 including warm bore 304. Cryostat shell 100 contains the magnet that produces the static magnetic field necessary for producing MRI images, as described above.

Also shown in FIG. 2 is a schematic view of a vibration isolation suspension arrangement consisting of bracket 112 solidly attached to the magnet cryostat 200, bracket 108 solidly attached to gradient assembly 190. Elastomeric layer 110 supports the weight of gradient assembly 190 and reduces the amplitude of vibrations transmitted from gradient assembly 190 to the magnet cryostat 200.

Leakage pulsed magnetic fields from the gradient assembly 190 create eddy currents in the cryostat inner bore 304. These eddy currents subject the cryostat bore 304 to Lorentz forces which produce vibrations and consequent MRI system acoustic noise as shown by WA Edelstein et al., *Magnetic Resonance Imaging* 20, 155-163, 2002.

Figure 3:
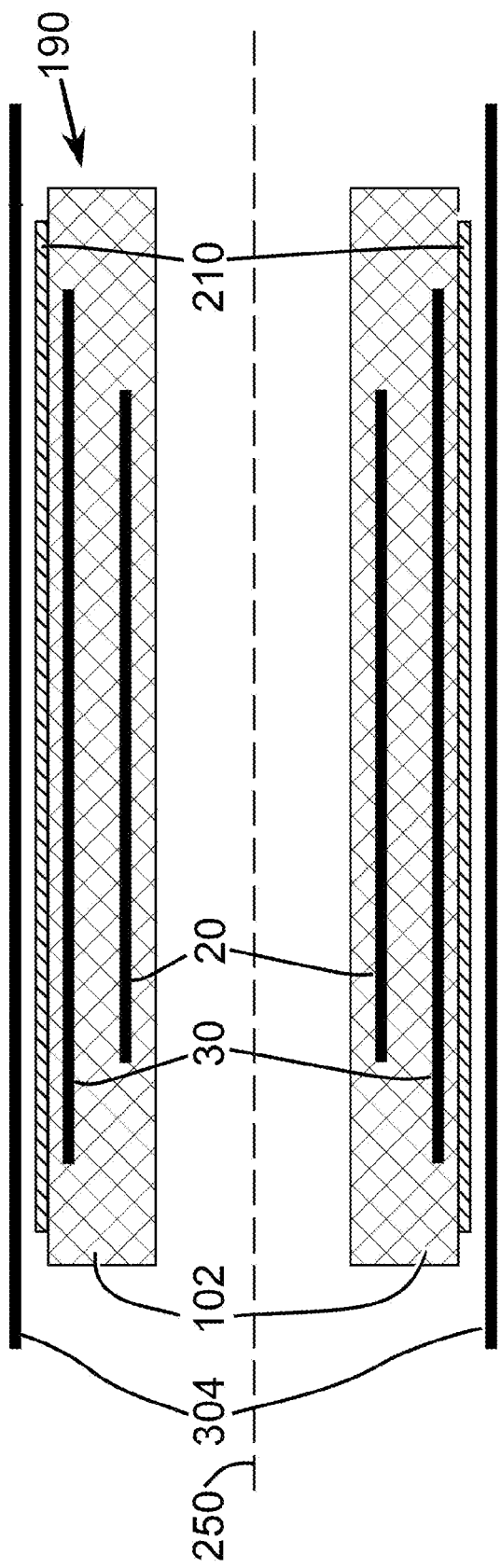
FIG. 3 is a cross-sectional side view of a prior art actively shielded gradient assembly with prior art passive shielding.

FIG. 3 illustrates an approach by Mulder et al., U.S. Pat. No. 6,326,788, 2001 to apply a passive shield in a position at a radius beyond the active gradient winding 20 plus 30. FIG. 3 is a cross-sectional side view of their design. It is similar to the conventional actively shielded gradient shown in FIG. 1 with the addition of a passive shield 210 consisting of a conducting layer positioned outside the active gradient winding 20 plus 30.

Figure 4:
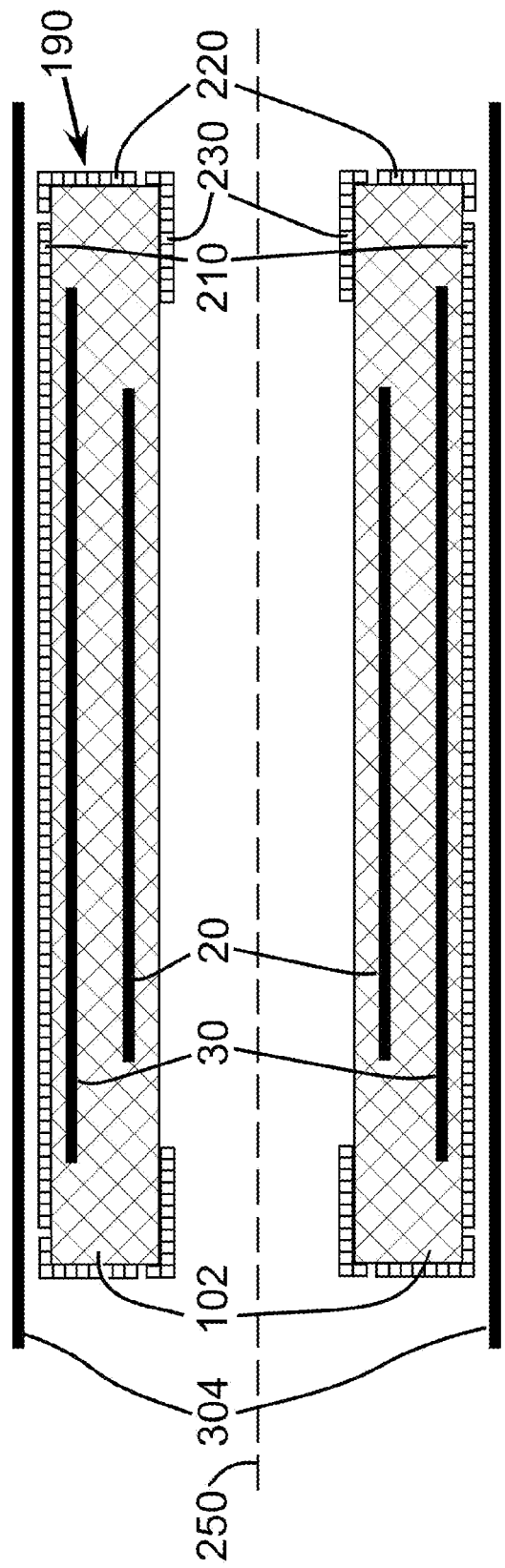
FIG. 4 is a cross-sectional side view of an actively shielded gradient assembly with passive shielding according to the invention.

FIG. 4 shows a gradient assembly 190 with extended passive electromagnetic shield comprised of conductive portions 210, 220 and 230. Portions 210, 220 and 230 should be a good electrical conductor, for example, copper. For the purpose of clarity, gaps are shown between portions 210 and 220 and gaps between conductive portions 220 and 230. However, in practice, 210 and 220 will generally be continuously electrically connected, as will 220 and 230, so the entire passive shield would consist of a single conducting layer consisting of portions 210, 220 and 230. Fields that escape from the active shielding windings 20 plus 30 would cause eddy currents in the passive shield 210 plus 220 plus 230. These eddy currents would help contain fields inside the passive shield and prevent those fields from interacting with the cryostat bore 304 or other metallic magnet system parts. It may be advantageous in some situations, however, to have gaps as shown here or in other positions to better optimize the operation of the gradient assembly 190.

Figure 7:
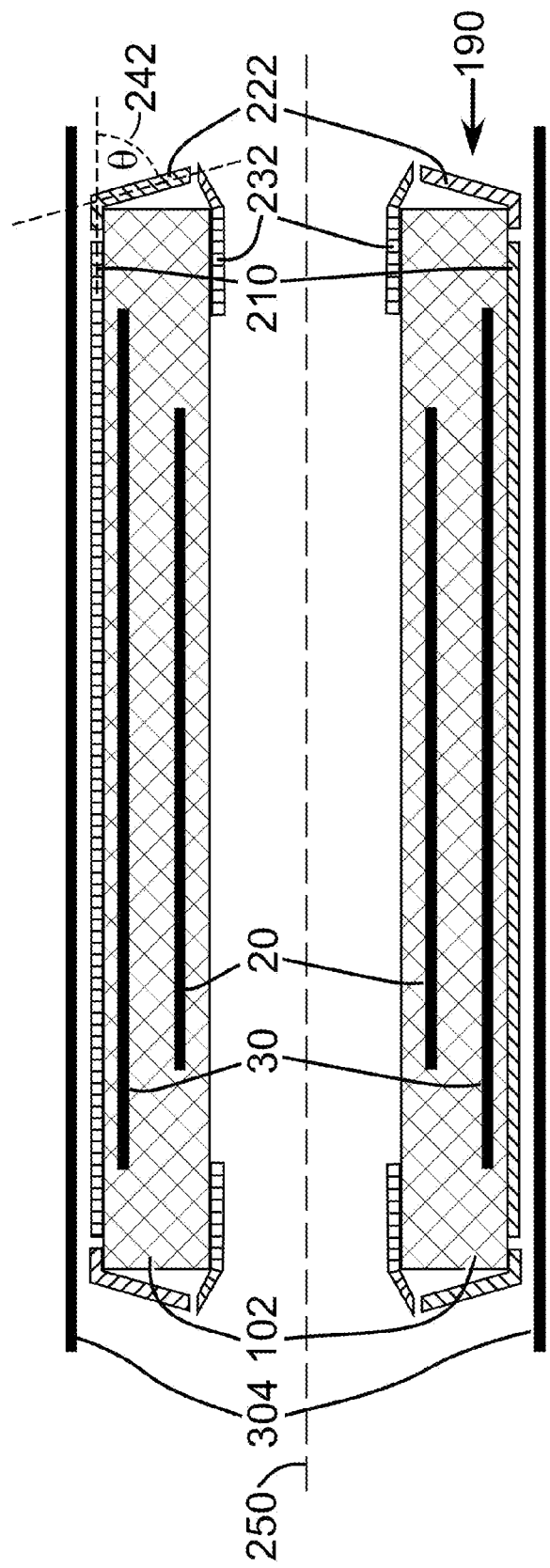
FIG. 7 is a cross-sectional side view of an actively shielded gradient assembly with passive shielding according the invention.
Figure 8:
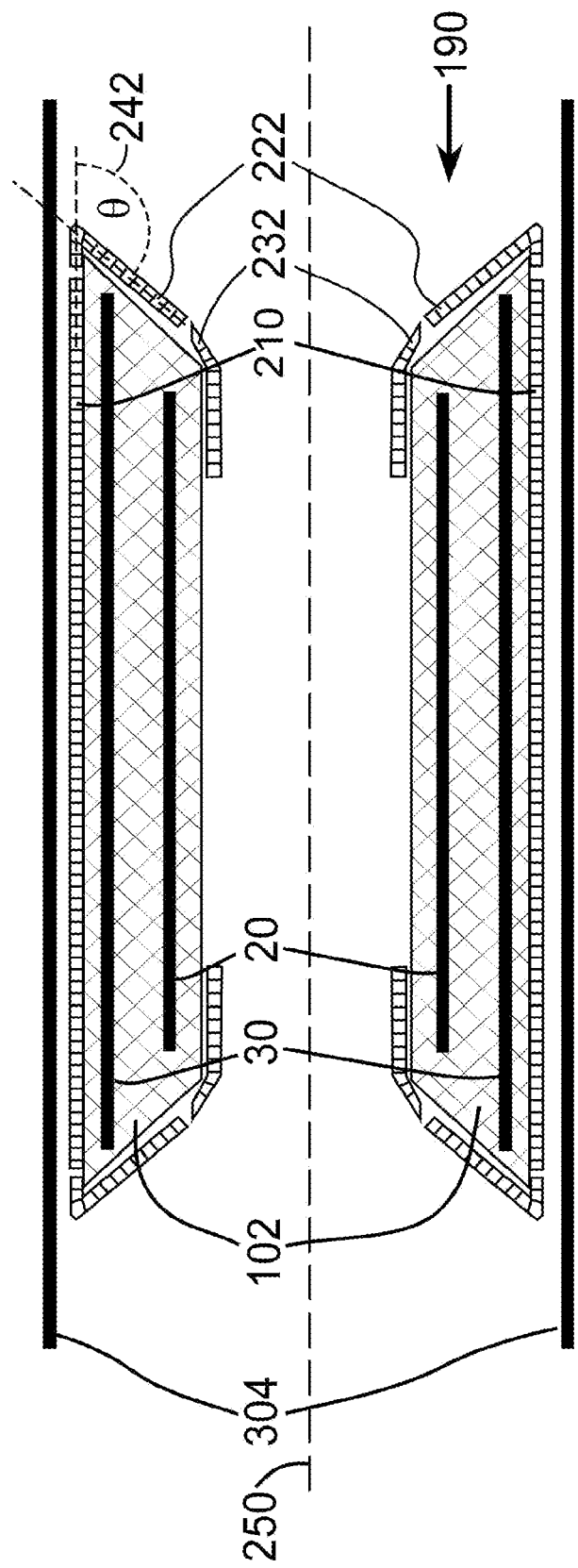
FIG. 8 is a cross-sectional side view of an actively shielded gradient assembly with passive shielding according the invention.

FIGS. 7-8 show gradient assembly 190 with an extended passive electromagnetic shield comprising conductive portions 210, 222 and 232. While a wide range of materials may be used, it is preferable that portions 210, 222 and 232 are made from a highly conductive material, such as copper. For the purpose of clarity, gaps are shown between portions 210, 222 and 232. However, in practice, portions 210, 222 and 232 are continuously electrically connected, so that the entire passive shield consists of a single conducting layer. During operation, fields that escape from the active shielding windings 20, 30 cause eddy currents in passive shields 210, 222 and 232. The eddy currents help contain fields inside the passive shield and prevent those fields from interacting with the cryostat bore 304 and other metallic magnet system parts. It may be advantageous in some situations, however, to have a gap between nonconducting annular cylindrical support structure 102 and the passive shield, in order to better optimize the operation of the gradient assembly 190. In the present invention, a first portion of the passive shielding element is located adjacent an outer surface of the actively shielded gradient winding and a second portion is located adjacent an end of the actively shielded gradient winding, wherein the second portion forms a non-perpendicular angle with the first portion of the passive shielding element.

As shown in FIG. 7, in one embodiment of the present invention, portion 232 is located adjacent the end of the actively shielded gradient windings 20, 30 and positioned to form angle 242 (θ) with portion 210. While angle 242 may be any angle, in a preferred embodiment, angle 242 is one of an acute and an obtuse angle. Furthermore, it should be understood that angle 242 may be perpendicular relative to portion 210. However, in the present embodiment, second portion 222 forms a non-perpendicular angle with first portion 210 of the passive shielding element. Third portion 232 of the passive shielding element is adjacent an inner surface of the actively shielded gradient coil windings 20, 30. Third portion 232 contains a first section and a second section, wherein the second section extends beyond the end of the actively shielded gradient coil and is angled to meet the second portion. As shown, the first section is adjacent to annular cylindrical support structure 102 and oriented substantially parallel to portion 210. The second section extends beyond the end of support structure 102 and is angled to meet second section 222. It can be appreciated by those skilled in the art, that an adjustment to angle 242 would influence the geometry of the second section. Also, although portion 222 is shown as being substantially straight, a person skilled in the art would recognize that a number of other geometries are possible.

As shown in FIG. 8, angle 242 may be obtuse relative to an axis formed along portion 210. In this embodiment, second portion 222 and cylindrical support structure 102 form an obtuse angle relative to the first portion 210. As shown by this embodiment, support structure 102 may take on a variety of geometries/dimensions. Third portion 232 contains a first section and a second section, wherein the second section extends beyond the end of the actively shielded gradient coil and is angled to meet the second portion. As shown, the first section is adjacent to annular cylindrical support structure 102 and oriented substantially parallel to portion 210. The second section extends beyond the end of support structure 102 and is angled to meet second section 222. Furthermore, although not shown, second portion may be positioned at an obtuse angle in the case that cylindrical support structure 102 is hollow. Although portion 222 is shown as being substantially straight, a person skilled in the art would recognize that a number of other geometries are possible.

Figure 9:
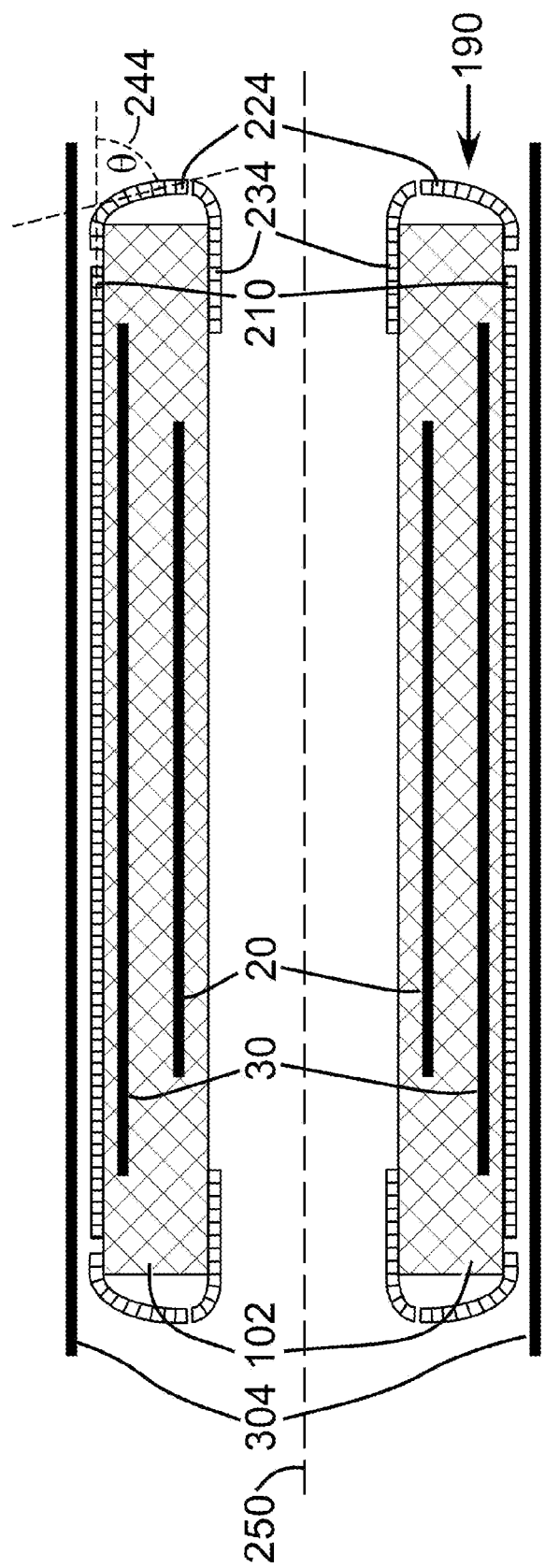
FIG. 9 is a cross-sectional side view of an actively shielded gradient assembly with passive shielding according the invention.

FIG. 9 shows another embodiment of gradient assembly 190 with extended passive electromagnetic shield comprised of conductive portions 210, 224 and 234. In this embodiment, a first portion of the passive shielding element is adjacent an outer surface of the actively shielded gradient coil and a second curvilinearly shaped portion is adjacent an end of the actively shielded gradient coil. As shown, portions 224 and 234 are curved and may be positioned at angle 244 relative to portion 210. It should be understood that angle 244 may be any angle. However, in the present embodiment, second portion 222 forms a non-perpendicular angle with first portion 210 of the passive shielding element. As also shown, third portion 234 of the passive shielding element is adjacent an inner surface of the actively shielded gradient coil winding, wherein third portion 234 contains a first section and a second section, and wherein the second section extends beyond the end of the actively shielded gradient coil and is curvilinearly shaped to meet second portion 224. Although portions 224, 234 are shown as being curvilinearly shaped and positioned at angle 244, a person skilled in the art would recognize that a number of other geometries and angles are possible. Finally, although shown in FIGS. 4-9 as having circular symmetry about the central symmetry axis 250 of the gradient assembly and reflective symmetry relative to the midplane of the gradient assembly, other embodiments having an asymmetric passive shielding portion are possible.

The additional conductive portions improve shielding efficacy. This is demonstrated by WA Edelstein et al., *Proc. Intl. Soc. Mag. Reson. Med.* 11, 747 (2004), where a comparison is made between the efficacy of a passive shield such as portion 210 only and a passive shield which consists of portions 210 and 220. For a 1 mm passive shield and a series of repeated trapezoidal pulses, and relative to a configuration with no passive shield, energy deposited in the cryostat bore 304 is reduced 14.7 dB with a passive shield consisting of portion 210 only and by 19.9 dB with a passive shield consisting of portions 210 and 220.

If a passive shield 210, 220 and 230 is positioned outside the gradient assembly, then any forces on this final shield may cause motion of the shield. However, if the passive shield is firmly mounted on the gradient assembly, its motion will be limited as compared to the motion of a thin cylinder such as the cryostat bore. Vibrational isolation of the gradient assembly 90 will prevent vibrations from the gradient assembly or passive shield from being conveyed to the rest of the MRI system and then causing acoustic noise. Finally, if a vacuum is created around the gradient assembly in airtight region 106, then motion of the gradient assembly or passive shield cannot cause acoustic noise to be conveyed through air.

The presence of passive shielding elements 210, 220 and 230 will alter the field distributions when active gradient winding 20 plus 30 is pulsed. Therefore it is important to design the active gradient winding 20 plus 30, and the passive shielding elements 210, 220 and 230 concurrently, in order to optimize the disposition of pulsed gradient fields in imaging region 201 and minimize the eddy currents created in cryostat inner bore 304 and other metallic magnet system parts.

Figure 5:
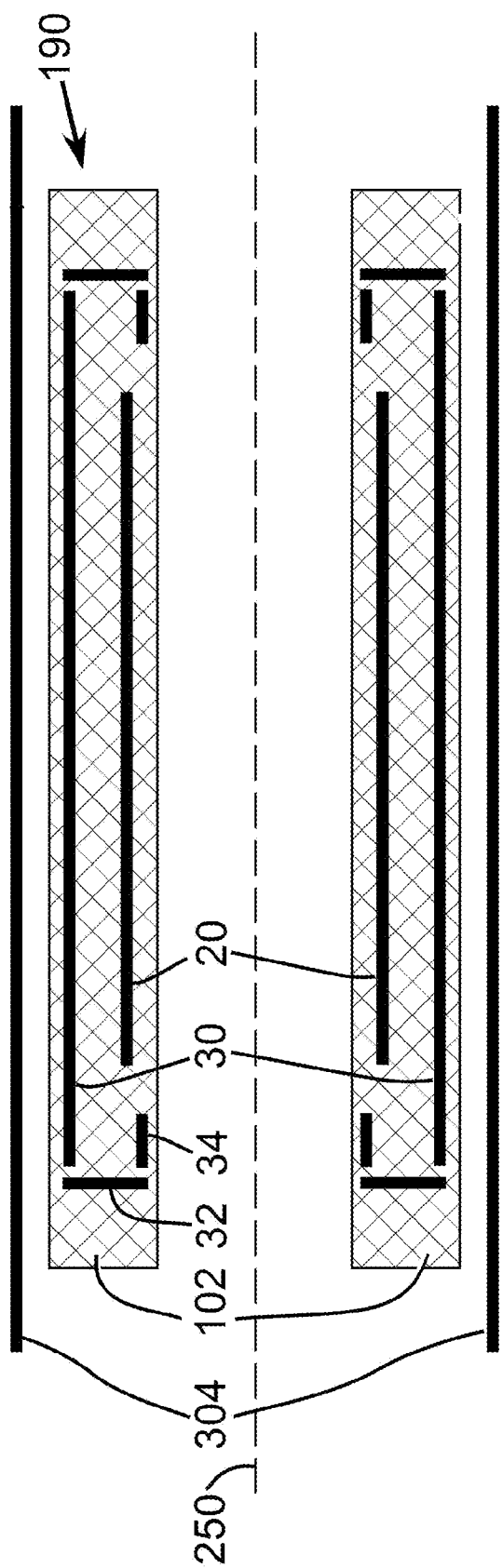
FIG. 5 is a cross-sectional side view of an actively shielded gradient assembly with extended active shielding according to the invention.
Figure 6:
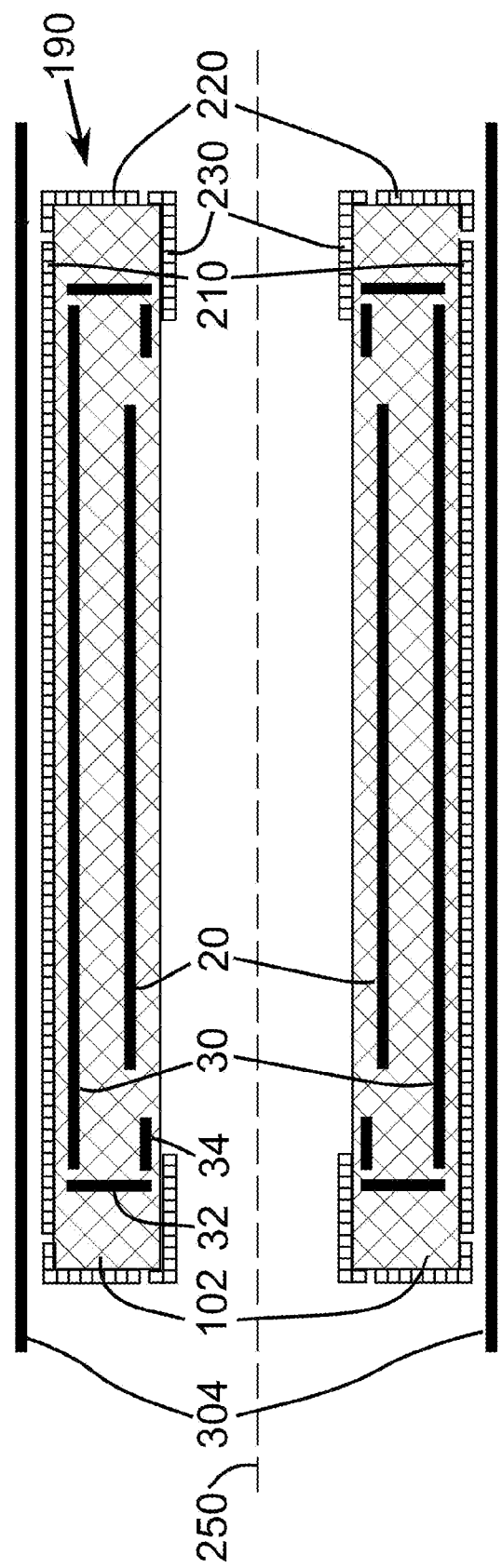
FIG. 6 is a cross-sectional side view of an actively shielded gradient assembly with passive shielding according to the invention and extended active shielding according to the invention.

The active shielding can also be extended to enhance its function as shown in FIGS. 5 and 6. FIG. 5 shows actively shielded gradient coil winding portion 30 extended to end portions 32 and, if advantageous, extended further to cylindrical portions 34. For the purpose of clarity, gaps are shown between portions 30 and 32 and gaps between conductive portions 32 and 34. However, in practice, 30 and 32 will generally be continuously electrically connected, as will 32 and 34, so the actively shielded gradient coil winding portion for each axis comprises a single conducting layer consisting of: portions 30 and 32; or portions 30 and 32 and 34. It may be advantageous in some situations, however, to have gaps as shown here or in other positions, so that different active gradient portions have separate power supplies, to better optimize the operation of the gradient assembly 190.

FIG. 6 shows a combination of extended actively shielded gradient coil winding and extended passive shield.

Acoustic noise will also be reduced if the passive shield is mounted on a separate structure, also vibrationally isolated and contained in a vacuum, outside the gradient assembly but separate from the cryostat/magnet structure. Reduction of eddy currents in the cryostat inner bore effected by the passive shield will reduce bore vibrations and consequent acoustic noise.

There may be additional undesirable eddy currents generated by the active outer shield or passive shield that lead to undesirable fields in the imaging region. For example, misalignment of the inner and outer gradient windings tends to produce extra, pulsed, uniform B0 magnetic fields (as opposed to gradient fields) synchronized with the pulsed gradient fields. This already happens in typical MRI systems because of interaction of misaligned gradient windings with the cryostat inner bore. It may therefore be desirable to include in this gradient package additional windings (uniform field, second order, third order, fourth order, etc.) that can be pulsed in order to cancel unwanted fields. These extra windings could be mounted on the inner actively shielded gradient winding portion 20, the outer actively shielded gradient winding portion 30, or anywhere at a radius less than that of the passive shielding 210 but at a radius greater than that of the gradient assembly inner bore. If necessary, a primary B0 (uniform field) winding, for example, could have an associated shielding B0 winding on the inner or outer windings. Higher-order windings and corresponding shielding windings could also be installed.

The initial magnitude of the eddy currents and consequent fields in the imaging region 201 will not change dramatically when supplementary passive shields 210, 220 and 230 are introduced. This is because the passive supplementary shields are at only a slightly smaller radius than the cryostat inner bore 304. However, using a copper passive shield, for example, will substantially increase the time constants of the eddy currents as compared to the time constants of eddy currents on the stainless steel bore. This is advantageous because longer time constants, and consequent slower variations of interfering fields, are easier to compensate than rapidly changing interfering fields.

An additional benefit of reducing leakage of pulsed magnetic fields is that eddy currents within the magnet structure will be reduced, thereby lessening power dissipation and undesirable heating of the magnet elements. Typically, the magnet elements are kept at very low temperatures by means of refrigeration or cryogenic fluids. Additional heating undesirably reduces efficiency of the magnet and increases operating costs.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for reducing acoustic noise in a magnetic resonance imaging device, the method comprising the steps of:
    providing an electrically conductive passive shielding element adjacent an actively shielded gradient coil winding of the device contained within an annular support structure; and
    ensuring the actively shielded gradient coil winding is insulated from the passive shielding element,
    wherein a first portion of the passive shielding element is located adjacent an outer surface of the actively shielded gradient winding and a second portion is located adjacent an end of the actively shielded gradient winding.

2. The method of claim 1, wherein the second portion forms a non-perpendicular angle with the first portion of the passive shielding element.

3. The method of claim 1, wherein the second portion is curvilinearly shaped.

4. The method of claim 1, wherein the providing step includes providing a third portion of the passive shielding element located adjacent an inner surface of the actively shielded gradient winding.

5. The method of claim 4, wherein the third portion has a first section and a second section, and wherein the second section extends beyond the end of the actively shielded gradient winding and is shaped to meet the second portion.

6. The method of claim 4, wherein the first and second portions are electrically connected, and wherein the third portion is electrically connected to at least one of the first and second portions.

7. The method of claim 1, wherein the providing step results in a design for the actively shielded gradient winding and the passive shielding element that substantially optimizes at least one of the gradient linearity and the minimized generation of eddy currents in metallic parts of the magnetic resonance imaging device.

8. An apparatus for reducing acoustic noise in a magnetic resonance imaging device, the apparatus comprising:
    an actively shielded gradient coil winding;
    an annular cylindrical support structure substantially enclosing the actively shielded gradient coil winding; and
    an electrically conductive passive shielding element adjacent the actively shielded gradient coil winding,
    wherein a first portion of the passive shielding element is located adjacent an outer surface of the actively shielded gradient coil and a second portion is located adjacent an end of the actively shielded gradient coil and positioned to form a non-perpendicular angle with the first portion of the passive shielding element.

9. The apparatus of claim 8, wherein a third portion of the passive shielding element is adjacent an inner surface of the actively shielded gradient coil winding.

10. The apparatus of claim 8, wherein the third portion contains a first section and a second section, wherein the second section extends beyond the end of the actively shielded gradient coil and is angled to meet the second portion.

11. The apparatus of claim 10, wherein the first and second portions are electrically connected, and wherein the third portion is electrically connected to at least one of the first and second portions.

12. The apparatus of claim 8, wherein a portion of the passive shielding element is electrically insulated from a portion of the actively shielded gradient coil winding.

13. The apparatus of claim 8, wherein the actively shielded gradient winding and the passive shielding element are designed to substantially optimize at least one of the gradient linearity and the minimized generation of eddy currents in metallic parts of the magnetic resonance imaging device.

14. An apparatus for reducing acoustic noise in a magnetic resonance imaging device, the apparatus comprising:
    an actively shielded gradient coil winding;
    an annular cylindrical support structure substantially enclosing the actively shielded gradient coil winding; and
    an electrically conductive passive shielding element adjacent the actively shielded gradient coil winding,
    wherein a first portion of the passive shielding element is located adjacent an outer surface of the actively shielded gradient coil and a second curvilinearly shaped portion is located adjacent an end of the actively shielded gradient coil.

15. The apparatus of claim 14, wherein a third portion of the passive shielding element is adjacent an inner surface of the actively shielded gradient coil winding.

16. The apparatus of claim 15, wherein the third portion contains a first section and a second section, wherein the second section extends beyond the end of the actively shielded gradient coil and is curvilinearly shaped to meet the second portion.

17. The apparatus of claim 15, wherein the first and second portions are electrically connected, and wherein the third portion is electrically connected to at least one of the first and second portions.

18. The apparatus of claim 14, wherein a portion of the passive shielding element is electrically insulated from a portion of the actively shielded gradient coil winding.

19. The apparatus of claim 14, wherein the actively shielded gradient winding and the passive shielding element are designed to substantially optimize at least one of the gradient linearity and the minimized generation of eddy currents in metallic parts of the magnetic resonance imaging device.

* * * * *